(12) United States Patent
Cheng

(10) Patent No.: US 7,417,906 B2
(45) Date of Patent: Aug. 26, 2008

(54) APPARATUS AND RELATED METHOD FOR CONTROLLING SWITCH MODULE IN MEMORY BY DETECTING OPERATION VOLTAGE OF MEMORY

(75) Inventor: Wen-Chang Cheng, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/563,214

(22) Filed: Nov. 27, 2006

(65) Prior Publication Data
US 2008/0080270 A1 Apr. 3, 2008

(30) Foreign Application Priority Data
Sep. 29, 2006 (TW) .............................. 95136193 A

(51) Int. Cl.
*G11C 7/00* (2006.01)
(52) U.S. Cl. .................................. 365/191; 365/233.05
(58) Field of Classification Search ................. 365/191, 365/233
See application file for complete search history.

(56) References Cited

U.S. PATENT DOCUMENTS 3,701,972 A * 10/1972 Berkeley et al. .............. 710/36
5,025,422 A   6/1991 Moriwaki
7,073,087 B2 * 7/2006 Horie et al. ................. 713/600
7,263,025 B2 * 8/2007 Park ........................... 365/233

FOREIGN PATENT DOCUMENTS

KR   1997-0051213   7/1997
KR   0161510        2/1999

* cited by examiner

*Primary Examiner*—Michael T Tran
(74) *Attorney, Agent, or Firm*—Winston Hsu

(57) ABSTRACT

An apparatus for controlling a switch module in a memory is disclosed. The apparatus includes first and second pulse width adjusting units, a decoder, and a detector. The first pulse width adjusting unit receives an input instruction signal and selectively adjusts a pulse width of the input instruction signal to generate an adjusted input instruction signal according to a first pulse width adjustment. The decoder receives an input address signal and the adjusted input instruction signal to generate a control signal to control the switch module to access data. The second pulse width adjusting unit receives the control signal and selectively adjusts a pulse width of the control signal to control the switch module according to a second pulse width adjustment. The detector detects electrical characteristic of an input signal to control the first and second pulse width adjusting units to set the first and second pulse width adjustments.

24 Claims, 2 Drawing Sheets

APPARATUS AND RELATED METHOD FOR CONTROLLING SWITCH MODULE IN MEMORY BY DETECTING OPERATION VOLTAGE OF MEMORY

BACKGROUND OF THE INVENTION

1. Field of the Invention

The present invention relates to a method for controlling memory data access, and more particularly, to an apparatus and related method for adjusting pulse widths to generate a control signal for controlling a switch module on a data transmission path in a memory by detecting an operation voltage of the memory.

2. Description of the Prior Art

In general, before accessing a sum of data, a microprocessor needs to send an input instruction signal (e.g. a data read instruction signal or a data write instruction signal) to a memory (e.g. a DRAM {Dynamic Random Access Memory}) for informing the memory a data access operation will be performed. It is also necessary for the microprocessor to send an input address signal corresponding to the sum of data to the memory such that the sum of data can be accessed correctly according to the input address signal. Before the sum of data is accessed, a decoder performs a decoding operation upon the input address signal and the input instruction signal simultaneously to output a control signal for controlling a turn-on period of a switch module in the memory so data can be accessed through the switch module. For example, data in memory cells within a specific memory bank in the memory can be accessed through the switch module when the switch module is turned on. Additionally, since the input instruction signal or the input address signal is usually inputted into the memory in the form of a voltage signal, the memory needs to use corresponding pins to receive the above-mentioned voltage signals. The voltage signal has a high voltage level (e.g. five Volts) or a low voltage level (e.g. zero Volts). An operating clock signal (i.e. a memory clock) is also necessary for the memory. The operating clock signal is utilized for estimating the voltage level corresponding to the input address signal in order to obtain information of the input address signal for performing a data access operation for the memory.

In practice, however, if an operation voltage of the memory arrives at a higher voltage level, the pulse width of the input instruction signal is shortened and the turn-on period of the switch module is also decreased. This reduces a period for accessing data. Otherwise, if the operation voltage of the memory arrives at a lower voltage level, the pulse width of the input instruction signal is extended and thus a decoder corresponding to the switch module in the memory may not operate properly. Please refer to FIG. 1. FIG. 1 is a timing diagram illustrating a prior art scheme for controlling the switch module in the memory for accessing data. The switch module is controlled by a signal CTRL to be turned on or turned off. As shown in FIG. 1, a signal CLK represents an operating clock signal of the memory, and a signal ADDR represents the input address signal. A signal $COM_1$ (e.g. a data read instruction signal or a data write instruction signal) represents the input instruction signal when the operation voltage of the memory is operated at a normal voltage level. A data read operation or data write operation is performed when the input instruction signal $COM_1$ remains at a high voltage level (e.g. the pulse width $PW_1$ of the input instruction signal $COM_1$). A signal $COM_2$ is an example of the input instruction signal for the operation voltage of the memory being operated at a higher voltage level. The pulse width of the control signal is involved due to the pulse width $PW_2$ of the input instruction signal $COM_2$, and thus the pulse width of the control signal becomes shorter than the pulse width $PW_{CTRL}$ of the control signal CTRL for the operation voltage of the memory being operated at a normal voltage level. This reduces the turn-on period of the switch module and a period for accessing data becomes shorter. On the other hand, a signal $COM_3$ is an example of the input instruction signal for the operation voltage of the memory being operated at a lower voltage level. The decoder is involved due to the pulse width $PW_3$ of the input instruction signal $COM_3$ and may not operate properly when performing a decoding operation. The reason is that the pulse width $PW_3$ may be too long to exceed a rising edge or a falling edge of the pulse width $PW_{ADDR}$ of the input address signal ADDR.

SUMMARY OF THE INVENTION

Therefore one of the objectives of the present invention is to provide an apparatus and related method for adjusting pulse widths to generate a control signal utilized for controlling a switch module according to an operation voltage of a memory, to solve the above-mentioned problems.

According to the claimed invention, an apparatus for controlling a switch module in a memory is disclosed. The apparatus comprises a first pulse width adjusting unit, a second pulse width adjusting unit, a decoder, and a detector. The first pulse width adjusting unit is utilized for receiving an input instruction signal and selectively adjusting a pulse width of the input instruction signal to generate an adjusted input instruction signal according to a first pulse width adjustment. The decoder is coupled to the first pulse width adjusting unit and utilized for receiving an input address signal and the adjusted input instruction signal to generate a control signal for controlling a turn-on period of the switch module for memory data access through the switch module. The second pulse width adjusting unit is coupled to the decoder and utilized for receiving the control signal outputted from the decoder and selectively adjusting a pulse width of the control signal to generate an adjusted control signal for controlling the switch module according to a second pulse width adjustment. The decoder is coupled to the first pulse width adjusting unit and the second pulse width adjusting unit, and is utilized for detecting an electronic power quality of an input signal to control the first and second pulse width adjusting units to set the first and second pulse width adjustments respectively.

According to the claimed invention, a method for controlling a switch module in a memory is disclosed. The method comprises: receiving an input instruction signal and selectively adjusting a pulse width of the input instruction signal to generate an adjusted input instruction signal according to a first pulse width adjustment; receiving an input address signal and the adjusted input instruction signal to generate a control signal to control a turn-on period of the switch module for memory data access through the switch module; receiving the control signal and selectively adjusting a pulse width of the control signal to generate an adjusted control signal for controlling the switch module according to a second pulse width adjustment; and detecting an electronic power quality of an input signal inputted into the memory to control the first and second pulse width adjusting units to set the first and second pulse width adjustments respectively These and other objectives of the present invention will no doubt become obvious to those of ordinary skill in the art after reading the following detailed description of the preferred embodiment that is illustrated in the various figures and drawings.

DETAILED DESCRIPTION

Figure 1:
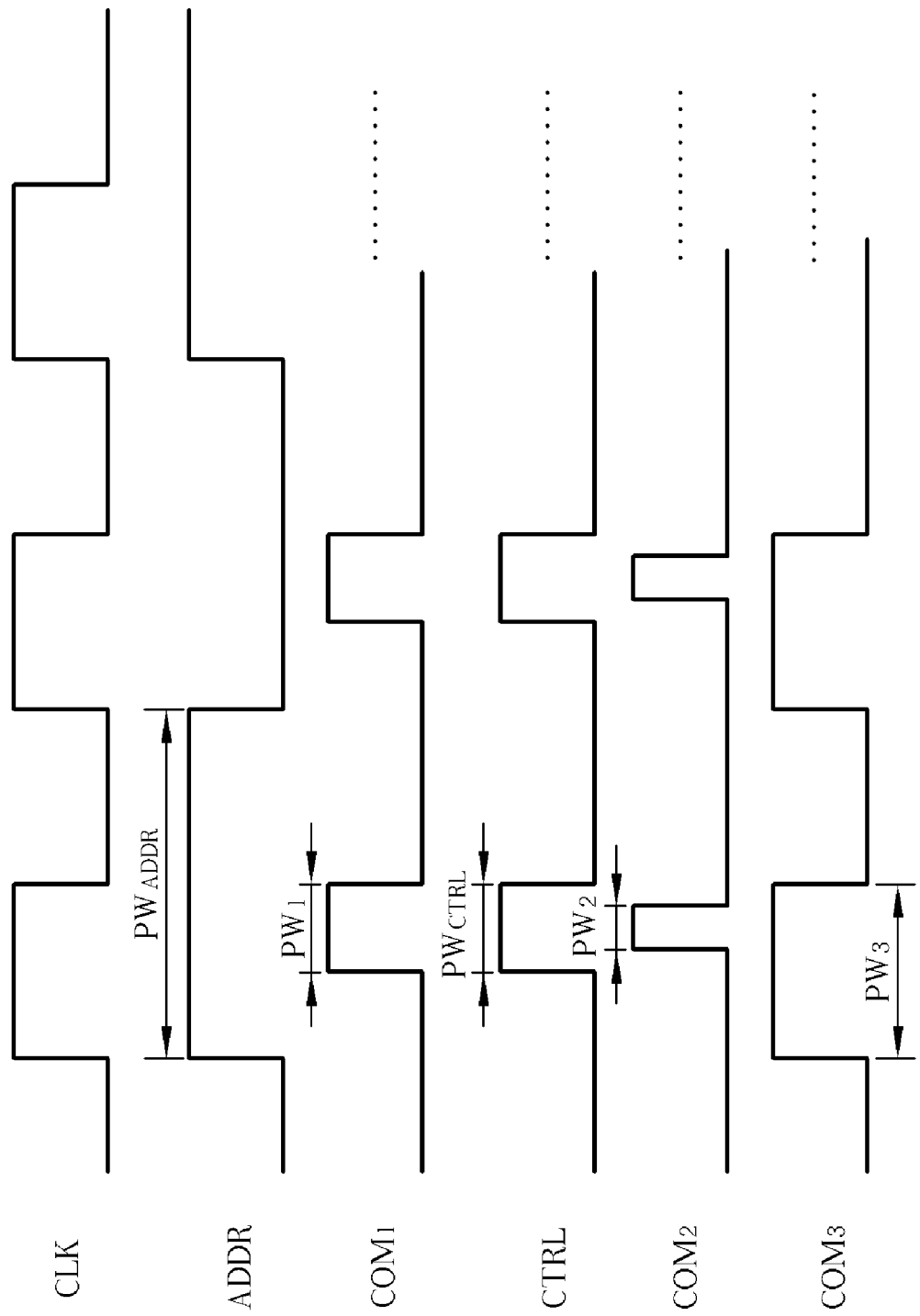
FIG. 1 is a timing diagram illustrating a prior art scheme for controlling the switch module in the memory for accessing data.
Figure 2:
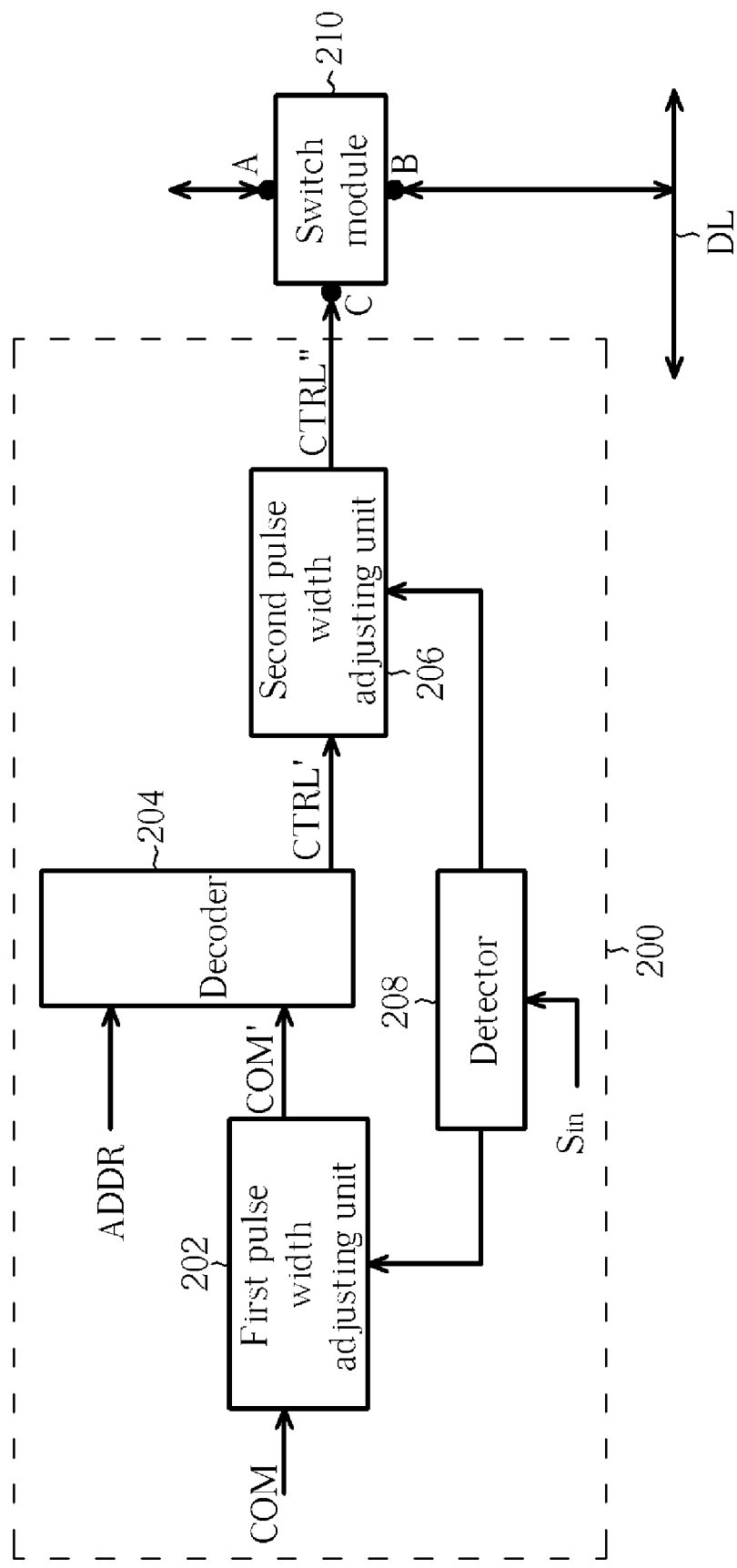
FIG. 2 is a diagram of an apparatus for controlling a switch module according to an embodiment of the present invention.

Please refer to FIG. 2. FIG. 2 is a diagram of an apparatus 200 for controlling a switch module 210 according to an embodiment of the present invention. In this embodiment, the apparatus 200 and the switch module 210 are both disposed in a memory (the memory is not shown in FIG. 2). As shown in FIG. 2, the apparatus 200 comprises a first pulse width adjusting unit 202, a decoder 204, a second pulse width adjusting unit 206, and a detector 208. The first pulse width adjusting unit 202 is utilized for adjusting a pulse width of an input instruction signal COM to generate an adjusted input instruction signal COM' according to a first pulse width adjustment. The decoder 204 is utilized for receiving an input address signal ADDR and the adjusted input instruction signal COM' to generate a control signal CTRL' for controlling the switch module 210. The second pulse width adjusting unit 206 is utilized for receiving the control signal CTRL' outputted from the decoder 204 and for adjusting a pulse width of the control signal CTRL' to generate an adjusted control signal CTRL'' according to a second pulse width adjustment so that the switch module 210 can be controlled to be turned on or turned off by the adjusted control signal CTRL''. The switch module 210 has a control terminal C and a plurality of data terminals A, B. When the adjusted control signal CTRL'' is received by the control terminal C and an electronic connection between the data terminals A, B is established, a data received by the data terminal A can be written into a memory cell in a specific memory bank in the memory through the data terminal B and a data line DL. A data stored in a memory cell in a specific memory bank in the memory can also be read through the data terminal B and the data line DL. The detector 208 is utilized for controlling the first pulse width adjusting unit 202 to set the first pulse width adjustment and for controlling the second pulse width adjusting unit 206 to set the second pulse width adjustment according to the operation voltage of the memory. It should be noted that, in this embodiment, the first pulse width adjusting unit 202 and the second pulse width adjusting unit 206 are implemented by controllable delay units so that pulse widths can be extended or shortened by exerting different delay amounts. The first pulse width adjustment and the second pulse width adjustment are the delay amounts exerted by the first pulse width adjusting unit 202 and the second pulse width adjusting unit 206 respectively. However, this is not a limitation of the present invention. Any scheme capable of adjusting pulse widths is also suitable for the first pulse width adjusting unit 202 and the second pulse width adjusting unit 206. In this embodiment, the detector 208 controls the first pulse width adjusting unit 202 to set the first pulse width adjustment and controls the second pulse width adjusting unit 206 to set the second pulse width adjustment by detecting a voltage level of the operation voltage of the memory; however, in other embodiments, a resistance unit can be utilized where the detector 208 then detects a current passing through the resistance unit for obtaining the voltage level of the operation voltage. Therefore, any scheme for detecting an electronic power quality of a specific signal in the memory (e.g. an electronic power quality (a voltage or a current) of an input signal $S_{in}$ for providing a voltage to operate the memory) to control the first pulse width adjusting unit 202 and the second pulse width adjusting unit 206 also falls within the scope of the present invention.

As mentioned above, for an operation of the first pulse width adjusting unit 202, when the input signal $S_{in}$ corresponds to a first voltage level $V_1$ and a pulse width of the input instruction signal COM corresponds to a first width $W_1$, the detector 208 controls the first pulse width adjusting unit 202 to set the first pulse width adjustment as a first delay amount $D_1$ to shorten the first width $W_1$. Otherwise, when the input signal $S_{in}$ corresponds to a second voltage level $V_2$ higher than the first voltage level $V_1$ and the pulse width of the input instruction signal COM corresponds to a second width $W_2$ shorter than the first width $W_1$, the detector 208 controls the first pulse width adjusting unit 202 to set the first pulse width adjustment as a second delay amount $D_2$ shorter than the first delay amount $D_1$ to shorten the second width $W_2$. In other words, when the input signal $S_{in}$ corresponds to a lower voltage level (i.e. the first voltage level $V_1$), the detector 208 controls the first pulse width adjusting unit 202 to set the first pulse width adjustment as a longer delay amount (i.e. the first delay amount $D_1$) to shorten the pulse width to avoid influencing the decoding operation of the decoder 204 since the pulse width corresponding to the lower voltage level becomes longer. When the input signal $S_{in}$ corresponds to a higher voltage level (i.e. the second voltage level $V_2$), the first pulse width adjusting unit 202 sets the first pulse width adjustment as a shorter delay amount (i.e. the second delay amount $D_2$) to shorten the pulse width. Please note that the first and second voltage levels $V_1$, $V_2$ are lower than a threshold voltage level $V_{th1}$ (it is a low threshold voltage level). That is, the first and second voltage levels $V_1$, $V_2$ are supposed to be much lower than the normal voltage level, and thus the corresponding first and second widths $W_1$, $W_2$ are much longer than a normal pulse width. It is necessary for the first and second widths $W_1$, $W_2$ to be shortened to avoid influencing the decoding operation of the decoder 204. Additionally, if the second voltage level $V_2$ becomes a voltage level higher than the above-mentioned threshold voltage level $V_{th1}$ but does not arrive at a threshold voltage level $V_{th2}$ (the threshold voltage level $V_{th2}$ is a high threshold voltage level and is higher than the threshold voltage level $V_{th1}$), the detector 208 controls the first pulse width adjusting unit 202 to maintain the pulse width of the input instruction signal COM; otherwise, for the first voltage level $V_1$ lower than the threshold voltage level $V_{th1}$, the detector 208 still controls the first pulse width adjusting unit 202 to set a delay amount to shorten the pulse width corresponding to the first voltage level $V_1$. That is, when a voltage level corresponding to the input signal $S_{in}$ exceeds the threshold voltage level $V_{th1}$ but does not arrive at the threshold voltage level $V_{th2}$, the detector 208 controls the first pulse width adjusting unit 202 to only maintain the pulse width since the decoder 204 does not operate erroneously due to a longer pulse width.

Furthermore, if other first and second voltage levels $V_1'$, $V_2'$ are higher than the threshold voltage level $V_{th2}$ (i.e. the high threshold voltage level) and the second voltage level $V_2'$ is lower than the first voltage level $V_1'$, it is very possible that extremely low pulse widths corresponding to the first and second voltage levels $V_1'$, $V_2'$ result, so a result of the decoding operation will not be correct. Therefore, in this situation, the detector 208 controls the first pulse width adjusting unit 202 to set the first pulse width adjustment as different delay amounts to extend the pulse widths corresponding to the first and second voltage levels $V_1'$, $V_2'$ respectively. Thus, the extremely lower pulse widths can be prevented from influencing the operation of the decoder 204. The scheme of setting the first pulse width adjustment as different delay amounts to extend the pulse width is detailed as follows. When the input signal $S_{in}$ corresponds to the first voltage level $V_1'$ and the pulse width of the input instruction signal COM corresponds to a first width $W_1'$, the detector 208 controls the first pulse width adjusting unit 202 to set the first pulse width adjustment as a first delay amount $D_1'$ to extend the first width $W_1'$. On the other hand, when the input signal $S_{in}$ corresponds to the second voltage level $V_2'$ lower than the first voltage level $V_1'$ and the pulse width of the input instruction signal COM corresponds to a second width $W_2'$ longer than the first width $W_1'$, the detector 208 controls the first pulse width adjusting unit 202 to set the first pulse width adjustment as a second delay amount $D_2'$ shorter than the first delay amount $D_1'$ to extend the second width $W_2'$.

Additionally, if the second voltage level $V_2'$ becomes a voltage level lower than the threshold voltage level $V_{th2}$ but not lower than the threshold voltage level $V_{th1}$, the detector 208 controls the first pulse width adjusting unit 202 to maintain the pulse width of the input instruction signal COM; otherwise, the detector 208 still controls the first pulse width adjusting unit 202 to set the first pulse width adjustment as a delay amount to extend the pulse width corresponding to the first voltage level $V_1'$ higher than the threshold voltage level $V_{th2}$. That is, when the voltage level corresponding to the input signal $S_{in}$ is lower than the threshold voltage level $V_{th2}$ but not lower than the threshold voltage level $V_{th1}$, the detector 208 controls the first pulse width adjusting unit 202 to only maintain the pulse width since the decoding operation is not involved. Moreover, if other first and second voltage levels $V_1''$, $V_2''$ are both lower than the threshold voltage level $V_{th2}$ but higher than the threshold voltage level $V_{th1}$, the detector 208 controls the first pulse width adjusting unit 202 to maintain the pulse widths of the input instruction signals corresponding to the first and second voltage levels $V_1''$, $V_2''$ respectively since the decoding operation is not involved. It should be noted that values of the threshold voltage levels $V_{th1}$, $V_{th2}$ can be designed according to users' requirements. This is not a limitation of the present invention.

For an operation of the second pulse width adjusting unit 206, when the input signal $S_{in}$ corresponds to a third voltage level $V_3$ and the pulse width of the control signal CTRL' corresponds to a third width $W_3$, the detector 208 controls the second pulse width adjusting unit 206 to set the second pulse width adjustment as a third delay amount $D_3$ to extend the third width $W_3$. On the other hand, when the input signal $S_{in}$ corresponds to a fourth voltage level $V_4$ lower than the third voltage level $V_3$ and the pulse width of the control signal CTRL' corresponds to a fourth width $W_4$ longer than the third width $W_3$, the detector 208 controls the second pulse width adjusting unit 206 to set the second pulse width adjustment as a fourth delay amount $D_4$ shorter than the third delay amount $D_3$ to extend the fourth width $W_4$. In this embodiment, the third and fourth voltage levels $V_3$, $V_4$ are assumed to be higher than the threshold voltage level $V_{th2}$. Although the pulse width corresponding to the voltage level higher than the threshold voltage level $V_{th2}$ has been extended by the first pulse width adjusting unit 202, it is also necessary for the second pulse width adjusting unit 206 to extend the pulse width of the control signal CTRL' adjusted by the first pulse width adjusting unit 202 for controlling the turn-on period of the switch module 210 correctly. In another embodiment, it is possible that the fourth voltage level $V_4$ is assumed to be lower than the threshold voltage level $V_{th2}$ but not lower than the threshold voltage level $V_{th1}$. In this situation, the detector 208 controls the second pulse width adjusting unit 206 to maintain the pulse width of the control signal CTRL'. However, the detector 208 still controls the second pulse width adjusting unit 206 to set the second pulse width adjustment as a delay amount to extend the pulse width corresponding to the third voltage level $V_3$ higher than the threshold voltage level $V_{th2}$. Additionally, if other third and fourth voltage levels $V_3'$, $V_4'$ are lower than the threshold voltage level $V_{th1}$ (i.e. a low threshold voltage level) and the fourth voltage level $V_4'$ is lower than the third voltage level $V_3'$, the pulse width of the input instruction signal COM corresponding to the third voltage level $V_3'$ or the fourth voltage levels $V_4'$ may be shortened due to the first pulse width adjusting unit 202. Then the pulse width of the control signal CTRL' is also shortened. It is therefore necessary for the second pulse width adjusting unit 206 to extend the pulse width of the control signal CTRL' for controlling the turn-on period of the switch module 210 properly. The scheme of extending the pulse width of the control signal CTRL' is detailed in the following. When the input signal $S_{in}$ corresponds to the third voltage level $V_3'$ and the pulse width of the control signal CTRL' corresponds to a third width $W_3'$, the detector 208 controls the second pulse width adjusting unit 206 to set the second pulse width adjustment as a third delay amount $D_3'$ to extend the third width $W_3'$. On the other hand, when the input signal $S_{in}$ corresponds to the fourth voltage level $V_4'$ lower than the third voltage level $V_3'$ and the pulse width of the control signal CTRL' corresponds to a fourth width $W_4'$ longer than the third width $W_3'$, the detector 208 controls the second pulse width adjusting unit 206 to set the second pulse width adjustment as a fourth delay amount $D_4'$ shorter than the third delay amount $D_3'$ to extend the fourth width $W_4'$. In another embodiment, it is possible that the third voltage level $V_3'$ is higher than the threshold voltage level $V_{th1}$ but not higher than the threshold voltage level $V_{th2}$. In this situation, the detector 208 controls the second pulse width adjusting unit 206 to maintain the pulse width of the control signal CTRL'. However, the detector 208 still controls the second pulse width adjusting unit 206 to set the second pulse width adjustment as a delay amount to extend the pulse width of the control signal CTRL' corresponding to the fourth voltage level $V_4'$. If there are other third and fourth voltage levels $V_3''$, $V_4''$ between the threshold voltage levels $V_{th1}$ and $V_{th2}$, the detector 208 controls the first pulse width adjusting unit 202 to only maintain the pulse width of the control signal CTRL' corresponding to the third voltage level $V_3''$ or the fourth voltage level $V_4''$ between the threshold voltage levels $V_{th1}$ and $V_{th2}$ since the decoder 204 is still operating correctly. Please note that, in this embodiment, values of the high and low threshold voltage levels (i.e. $V_{th2}$, $V_{th1}$) utilized by the detector 208 for controlling the first pulse width adjusting unit 202 are respectively identical to those utilized by the detector 208 for controlling the second pulse width adjusting unit 206. However, in other embodiments, the first and second pulse width adjusting units 202, 206 can still operate correctly even though values of the high and low threshold voltage levels utilized by the detector 208 for controlling the first pulse width adjusting unit 202 are not identical to those utilized by the detector 208 for controlling the second pulse width adjusting unit 206. This also obeys the spirit of the present invention.

Please note that it is preferred that the first pulse width adjusting unit 202 and the second pulse width adjusting unit 206 are utilized simultaneously. In another embodiment, only utilizing the first pulse width adjusting unit 202 or the second pulse width adjusting unit 206 is also workable. This may not simultaneously avoid the problem caused by an erroneous operation of the decoder 204 resulting from a shorter pulse width of an input instruction signal and the problem caused by a shorter period for accessing memory data resulting from a shorter pulse width of a control signal. However, only utilizing the first pulse width adjusting unit 202 or the second pulse width adjusting unit 206 is also helpful for solving the above-mentioned problems. This also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for controlling a switch module in a memory, comprising:
    a first pulse width adjusting unit, for receiving an input instruction signal and selectively adjusting a pulse width of the input instruction signal to generate an adjusted input instruction signal according to a first pulse width adjustment;
    a decoder, coupled to the first pulse width adjusting unit, for receiving an input address signal and the adjusted input instruction signal to generate a control signal for controlling a turn-on period of the switch module for memory data access through the switch module;
    a second pulse width adjusting unit, coupled to the decoder, for receiving the control signal outputted from the decoder and selectively adjusting a pulse width of the control signal to generate an adjusted control signal for controlling the switch module according to a second pulse width adjustment; and
    a detector, coupled to the first pulse width adjusting unit and the second pulse width adjusting unit, for detecting an electronic power quality of an input signal for controlling the first and second pulse width adjusting units to set the first and second pulse width adjustments respectively.

2. The apparatus of claim 1, wherein the input signal is utilized for providing the memory with an operating voltage, and the detector is utilized for detecting a voltage level of the operating voltage to control the first pulse width adjusting unit.

3. The apparatus of claim 2, wherein the first pulse width adjusting unit is a controllable delay unit; when the input signal corresponds to a first voltage level and the pulse width of the input instruction signal corresponds to a first width, the detector controls the first pulse width adjusting unit to set the first pulse width adjustment as a first delay amount to shorten the first width; and when the input signal corresponds to a second voltage level higher than the first voltage level and the pulse width of the input instruction signal corresponds to a second width shorter than the first width, the detector controls the first pulse width adjusting unit to set the first pulse width adjustment as a second delay amount shorter than the first delay amount to shorten the second width.

4. The apparatus of claim 3, wherein the detector controls the first pulse width adjusting unit to maintain the pulse width of the input instruction signal if the second voltage level reaches a threshold voltage level.

5. The apparatus of claim 3, wherein the second pulse width adjusting unit is a controllable delay unit; when the input signal corresponds to a third voltage level and the pulse width of the control signal corresponds to a third width, the detector controls the second pulse width adjusting unit to set the second pulse width adjustment as a third delay amount to lengthen the third width; and when the input signal corresponds to a fourth voltage level lower than the third voltage level and the pulse width of the control signal corresponds to a fourth width longer than the third width, the detector controls the second pulse width adjusting unit to set the second pulse width adjustment as a fourth delay amount shorter than the third delay amount to lengthen the fourth width.

6. The apparatus of claim 5, wherein the detector controls the second pulse width adjusting unit to maintain the pulse width of the control signal if the fourth voltage level reaches a threshold voltage level.

7. The apparatus of claim 2, wherein the first pulse width adjusting unit is a controllable delay unit; when the input signal corresponds to a first voltage level and the pulse width of the input instruction signal corresponds to a first width, the detector controls the first pulse width adjusting unit to set the first pulse width adjustment as a first delay amount to lengthen the first width; and when the input signal corresponds to a second voltage level lower than the first voltage level and the pulse width of the input instruction signal corresponds to a second width longer than the first width, the detector controls the first pulse width adjusting unit to set the first pulse width adjustment as a second delay amount shorter than the first delay amount to lengthen the second width.

8. The apparatus of claim 7, wherein the detector controls the first pulse width adjusting unit to maintain the pulse width of the input instruction signal if the second voltage level reaches a threshold voltage level.

9. The apparatus of claim 7, wherein the second pulse width adjusting unit is a controllable delay unit; when the input signal corresponds to a third voltage level and the pulse width of the control signal corresponds to a third width, the detector controls the second pulse width adjusting unit to set the second pulse width adjustment as a third delay amount to lengthen the third width; and when the input signal corresponds to a fourth voltage level lower than the third voltage level and the pulse width of the control signal corresponds to a fourth width longer than the third width, the detector controls the second pulse width adjusting unit to set the second pulse width adjustment as a fourth delay amount shorter than the third delay amount to lengthen the fourth width.

10. The apparatus of claim 9, wherein the detector controls the second pulse width adjusting unit to maintain the pulse width of the control signal if the fourth voltage level reaches a threshold voltage level.

11. The apparatus of claim 2, wherein the second pulse width adjusting unit is a controllable delay unit; when the input signal corresponds to a first voltage level and the pulse width of the control signal corresponds to a first width, the detector controls the second pulse width adjusting unit to set the second pulse width adjustment as a first delay amount for lengthening the first width; and when the input signal corresponds to a second voltage level lower than the first voltage level and the pulse width of the control signal corresponds to a second width longer than the first width, the detector controls the second pulse width adjusting unit to set the second pulse width adjustment as a second delay amount shorter than the first delay amount for lengthening the second width.

12. The apparatus of claim 11, wherein the detector controls the second pulse width adjusting unit to maintain the pulse width of the control signal if the second voltage level reaches a threshold voltage level.

13. A method for controlling a switch module in a memory, comprising:
    receiving an input instruction signal and selectively adjusting a pulse width of the input instruction signal to generate an adjusted input instruction signal according to a first pulse width adjustment;
    receiving an input address signal and the adjusted input instruction signal to generate a control signal for controlling a turn-on period of the switch module for memory data access through the switch module;

receiving the control signal and selectively adjusting a pulse width of the control signal to generate an adjusted control signal for controlling the switch module according to a second pulse width adjustment; and detecting an electronic power quality of an input signal for controlling the first and second pulse width adjusting units to set the first and second pulse width adjustments respectively.

14. The method of claim 13, wherein the input signal is utilized for providing the memory with an operating voltage, and the step of detecting the electronic power quality of the input signal to set the first pulse width adjustment comprises:

detecting a voltage level of the operating voltage to set the first pulse width adjustment.

15. The method of claim 14, wherein the step of detecting the voltage level of the operating voltage to set the first pulse width adjustment comprises:

when the input signal corresponds to a first voltage level and the pulse width of the input instruction signal corresponds to a first width, setting the first pulse width adjustment as a first delay amount to shorten the first width; and when the input signal corresponds to a second voltage level higher than the first voltage level and the pulse width of the input instruction signal corresponds to a second width shorter than the first width, setting the first pulse width adjustment as a second delay amount shorter than the first delay amount to shorten the second width.

16. The method of claim 15, wherein the step of detecting the voltage level of the operating voltage to set the first pulse width adjustment further comprises:

maintaining the first pulse width adjustment to maintain the pulse width of the input instruction signal if the second voltage level reaches a threshold voltage level.

17. The method of claim 15, wherein the step of setting the second pulse width adjustment according to the input signal comprises:

when the input signal corresponds to a third voltage level and the pulse width of the control signal corresponds to a third width, setting the second pulse width adjustment as a third delay amount to lengthen the third width; and when the input signal corresponds to a fourth voltage level lower than the third voltage level and the pulse width of the control signal corresponds to a fourth width longer than the third width, setting the second pulse width adjustment as a fourth delay amount shorter than the third delay amount to lengthen the fourth width.

18. The method of claim 17, wherein the step of setting the second pulse width adjustment according to the input signal further comprises:

maintaining the second pulse width adjustment to maintain the pulse width of the control signal if the fourth voltage level reaches a threshold voltage level.

19. The method of claim 14, wherein the step of detecting the voltage level of the operating voltage to set the first pulse width adjustment comprises:

when the input signal corresponds to a first voltage level and the pulse width of the input instruction signal corresponds to a first width, setting the first pulse width adjustment as a first delay amount to lengthen the first width; and when the input signal corresponds to a second voltage level lower than the first voltage level and the pulse width of the input instruction signal corresponds to a second width longer than the first width, setting the first pulse width adjustment as a second delay amount shorter than the first delay amount to lengthen the second width.

20. The method of claim 19, wherein the step of detecting the voltage level of the operating voltage to set the first pulse width adjustment further comprises:

maintaining the first pulse width adjustment to maintain the pulse width of the input instruction signal if the second voltage level reaches a threshold voltage level.

21. The method of claim 19, wherein the step of setting the second pulse width adjustment according to the input signal comprises:

when the input signal corresponds to a third voltage level and the pulse width of the control signal corresponds to a third width, setting the second pulse width adjustment as a third delay amount to lengthen the third width; and when the input signal corresponds to a fourth voltage level lower than the third voltage level and the pulse width of the control signal corresponds to a fourth width longer than the third width, setting the second pulse width adjustment as a fourth delay amount shorter than the third delay amount to lengthen the fourth width.

22. The method of claim 21, wherein the step of setting the second pulse width adjustment according to the input signal further comprises:

maintaining the second pulse width adjustment to maintain the pulse width of the control signal if the fourth voltage level reaches a threshold voltage level.

23. The method of claim 14, wherein the step of setting the second pulse width adjustment according to the input signal comprises:

when the input signal corresponds to a first voltage level and the pulse width of the control signal corresponds to a first width, setting the second pulse width adjustment as a first delay amount to lengthen the first width; and when the input signal corresponds to a second voltage level lower than the first voltage level and the pulse width of the control signal corresponds to a second width longer than the first width, setting the second pulse width adjustment as a second delay amount shorter than the first delay amount to lengthen the second width.

24. The method of claim 23, wherein the step of setting the second pulse width adjustment according to the input signal further comprises:

maintaining the second pulse width adjustment to maintain the pulse width of the control signal if the second voltage level reaches a threshold voltage level.

* * * * *